US010877752B2

(12) United States Patent
Chen et al.

(10) Patent No.: US 10,877,752 B2
(45) Date of Patent: Dec. 29, 2020

(54) TECHNIQUES FOR CURRENT-SENSING CIRCUIT DESIGN FOR COMPUTE-IN-MEMORY

(71) Applicant: Intel Corporation, Santa Clara, CA (US)

(72) Inventors: Gregory K. Chen, Portland, OR (US); Raghavan Kumar, Hillsboro, OR (US); Huseyin Ekin Sumbul, Portland, OR (US); Phil Knag, Hillsboro, OR (US); Ram Krishnamurthy, Portland, OR (US); Sasikanth Manipatruni, Portland, OR (US); Amrita Mathuriya, Portland, OR (US); Abhishek Sharma, Hillsboro, OR (US); Ian A. Young, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 51 days.

(21) Appl. No.: 16/146,430

(22) Filed: Sep. 28, 2018

(65) Prior Publication Data

US 2019/0102170 A1    Apr. 4, 2019

(51) Int. Cl.
| G06F 7/544 | (2006.01) |
| G06F 9/30 | (2018.01) |
| G06F 9/38 | (2018.01) |
| G11C 13/00 | (2006.01) |
| G11C 11/419 | (2006.01) |
| G11C 7/06 | (2006.01) |

(Continued)

(52) U.S. Cl.
CPC .......... G06F 9/3001 (2013.01); G06F 7/5443 (2013.01); G06F 9/3893 (2013.01); G11C 7/062 (2013.01); G11C 7/1006 (2013.01); G11C 7/16 (2013.01); G11C 11/419 (2013.01); G11C 11/54 (2013.01); G11C 13/004 (2013.01); G11C 13/0026 (2013.01); G11C 13/0028 (2013.01)

(58) Field of Classification Search
CPC .............................. G06F 7/5443; G06F 17/16
See application file for complete search history.

(56) References Cited

U.S. PATENT DOCUMENTS

| 6,658,440 B1 | 12/2003 | Pisek et al. |
| 2003/0128579 A1 | 7/2003 | Sakimura et al. |

(Continued)

OTHER PUBLICATIONS

Ambrogio, S., et al., "Equivalent-Accuracy Accelerated Neural-Network Training Using Analogue Memory," Nature, vol. 558, Jun. 7, 2018, 22 pages.

(Continued)

*Primary Examiner* — Chuong D Ngo
(74) *Attorney, Agent, or Firm* — Compass IP Law PC

(57) ABSTRACT

A compute-in-memory (CIM) circuit that enables a multiply-accumulate (MAC) operation based on a current-sensing readout technique. An operational amplifier coupled with a bitline of a column of bitcells included in a memory array of the CIM circuit to cause the bitcells to act like ideal current sources for use in determining an analog voltage value outputted from the operational amplifier for given states stored in the bitcells and for given input activations for the bitcells. The analog voltage value sensed by processing circuitry of the CIM circuit and converted to a digital value to compute a multiply-accumulate (MAC) value.

18 Claims, 8 Drawing Sheets

(51) Int. Cl.
*G11C 11/54* (2006.01)
*G11C 7/16* (2006.01)
*G11C 7/10* (2006.01)

(56) References Cited

U.S. PATENT DOCUMENTS

| | | | |
|---|---|---|---|
| 2011/0072204 A1 | 3/2011 | Chang et al. | |
| 2011/0113115 A1 | 5/2011 | Chang et al. | |
| 2011/0148488 A1 | 6/2011 | Lee et al. | |
| 2014/0063914 A1 | 3/2014 | Kanamori | |
| 2014/0292552 A1 | 10/2014 | Kim et al. | |
| 2015/0357024 A1 | 12/2015 | Hush et al. | |
| 2016/0063284 A1 | 3/2016 | Tiwari | |
| 2016/0086673 A1 | 3/2016 | Yamada | |
| 2016/0266873 A1 | 9/2016 | Tiwari et al. | |
| 2016/0294281 A1 | 10/2016 | Kulkarni et al. | |
| 2018/0004687 A1 | 1/2018 | Bernat et al. | |
| 2018/0088850 A1 | 3/2018 | Willcock | |
| 2018/0315473 A1 | 11/2018 | Yu et al. | |
| 2018/0373675 A1* | 12/2018 | Strachan | G06F 17/141 |
| 2019/0189174 A1* | 6/2019 | Hu | G11C 13/0002 |
| 2019/0205729 A1* | 7/2019 | Tran | G06N 3/063 |
| 2019/0213234 A1* | 7/2019 | Bayat | G11C 16/0483 |

OTHER PUBLICATIONS

Biswas, A., et al., "A 42pJ/decision 3.12TOPS/W Robust In-Memory Machine Learning Classifier With On-Chip Training," 2018 IEEE International Solid-State Circuits Conference—(ISSCC), San Francisco, CA, 2018, pp. 488-490.

Fick, D., et al., "Analog Computation in Flash Memory for Datacenter-Scale AI Inference in a Small Chip", 2.05 Mythic Hot Chips, 2018, 28 pages.

Gonugondla, S.K., et al., "A 42pJ/decision 3.12TOPS/W Robust In-Memory Machine Learning Classifier With On-Chip Training," 2018 IEEE International Solid-State Circuits Conference—(ISSCC), San Francisco, CA, 2018, pp. 490-492.

Henzler, S., Chapter 2, Time-to-Digital Converter Basics, Springer Series in Advanced Microelectronics 29, 2, Springer Science+Business Media B.V. 2010.

Kang, M., et al., "An In-Memory VLSI Architecture for Convolutional Neural Networks", http://ieee-cas.org/pubs/jetcas, Published Version DOI: 10.1109/JETCAS.2018.2829522, Publication Apr. 23, 2018, IEEE Circuits and Systems Society, 13 pages.

Mason, A., Memory Basics, Michigan State, ECE 410, Chapter 13 Lecture Notes, pp. 13.1-13.34, 2010.

Solanki, Umang, How does SRAM work?, https://www.quora.com/How-does-SRAM-work, Aug. 17, 2017, 2 pages.

Stone, Harold S. "A Logic-In-Memory Computer", IEEE Transactions on Computers, Jan. 1970, 6 pages.

Zhang, J., et al., "In-Memory Computation of a Machine-Learning Classifier in a Standard 6T SRAM Array," in IEEE Journal of Solid-State Circuits, vol. 52, No. 4, 10 pages, Apr. 2017.

"Analog Multipliers," Analog Devices MT-079 Tutorial, 8 pages.

Allen, "Lecture 110—Phase Frequency Detectors," ECE 6440-Frequency Synthesizers, Jun. 9, 2003, 18 pages.

Final Office Action for U.S. Appl. No. 16/147,024, dated Feb. 26, 2020, 10 pages.

First Office Action for U.S. Appl. No. 16/146,473, dated Dec. 30, 2019, 6 pages.

First Office Action for U.S. Appl. No. 16/147,024, dated Oct. 3, 2019, 9 pages.

Han, et al, "CMOS Transconductance Multipliers: A Tutorial," IEEE Transactions on Circuits and Systems—II: Analog and Digital Signal Processing, vol. 45, No. 12, Dec. 1998.

Notice of Allowance for U.S. Appl. No. 16/146,473, dated Apr. 17, 2020, 5 pages.

* cited by examiner

TECHNIQUES FOR CURRENT-SENSING CIRCUIT DESIGN FOR COMPUTE-IN-MEMORY

TECHNICAL FIELD

Descriptions are generally related to a compute-in-memory (CIM) circuit.

BACKGROUND

Computer artificial intelligence (AI) has been built on machine learning, particularly using deep learning techniques. With deep learning, a computing system organized as a neural network computes a statistical likelihood of a match of input data with prior computed data. A neural network refers to a plurality of interconnected processing nodes that enable the analysis of data to compare an input to "trained" data. Trained data refers to computational analysis of properties of known data to develop models to use to compare input data. An example of an application of AI and data training is found in object recognition, where a system analyzes the properties of many (e.g., thousands or more) of images to determine patterns that can be used to perform statistical analysis to identify an input object such as a person's face.

Neural networks compute "weights" to perform computations on new data (an input data "word"). Neural networks use multiple layers of computational nodes, where deeper layers perform computations based on results of computations performed by higher layers. Machine learning currently relies on the computation of dot-products and absolute difference of vectors, typically computed with multiply and accumulate (MAC) operations performed on the parameters, input data and weights. Because these large and deep neural networks may include many such data elements, these data elements are typically stored in a memory separate from processing elements that perform the MAC operations.

Due to the computation and comparison of many different data elements, machine learning is extremely compute intensive. Also, the computation of operations within a processor are typically orders of magnitude faster than the transfer of data between the processor and memory resources used to store the data. Placing all the data closer to the processor in caches is prohibitively expensive for the great majority of practical systems due to the need for large data capacities of close proximity caches. Thus, the transfer of data when the data is stored in a memory separate from processing elements becomes a major bottleneck for AI computations. As the data sets increase in size, the time and power/energy a computing system uses for moving data between separately located memory and processing elements can end up being multiples of the time and power used to actually perform AI computations.

DETAILED DESCRIPTION

Figure 1:
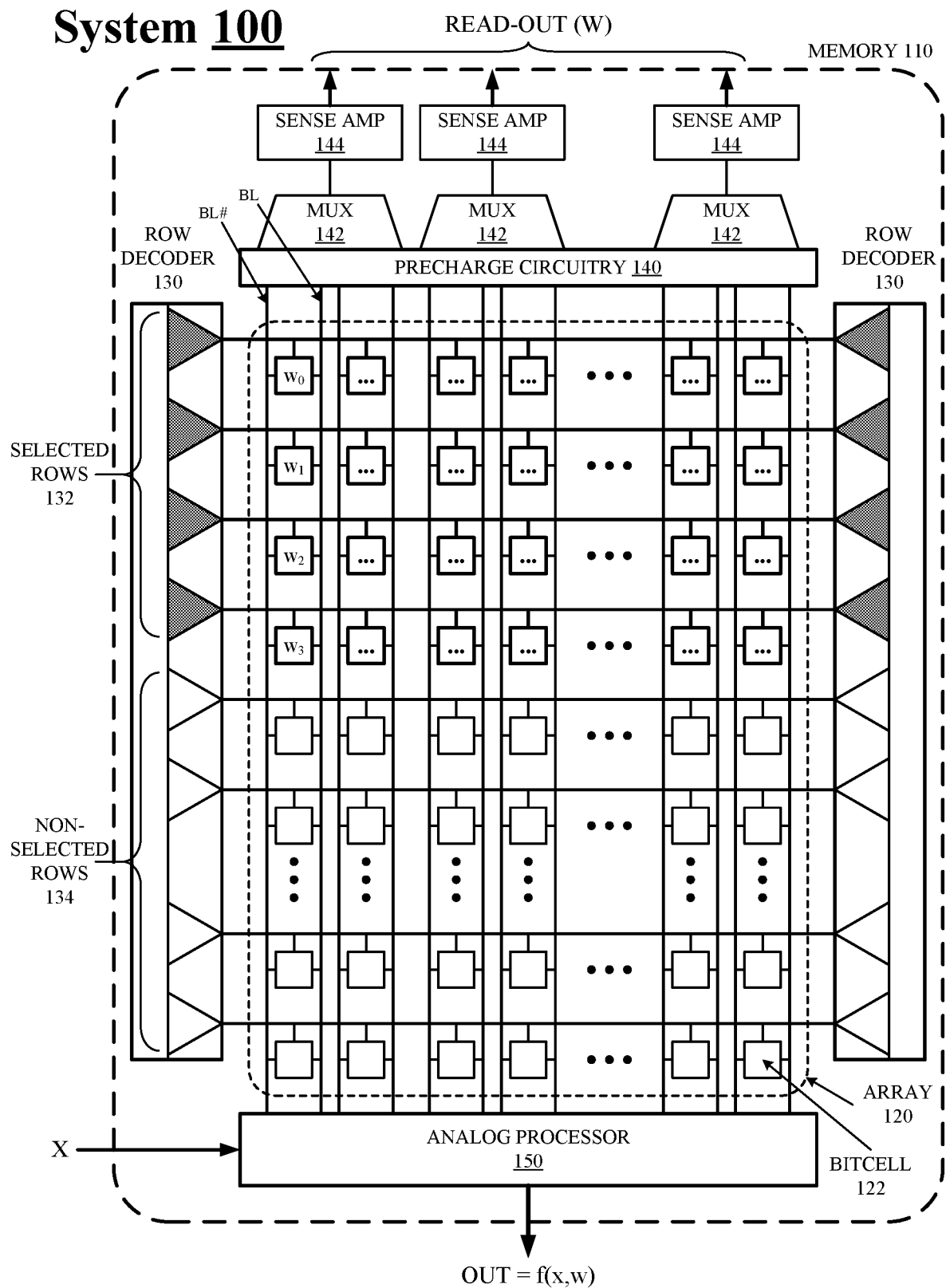
FIG. 1 illustrates an example first system.

A relatively new technology known as compute-in-memory (CIM) attempts to both reduce energy for data movement and increase an effective memory bandwidth for data consumed in deep-learning applications. CIM circuit based accelerators can perform operations such as dot-product and absolute difference of vectors locally stored within an array of memory cells (e.g., bitcells) without having to send data to a host processor. CIM accelerators targeted for various deep-learning applications perform MAC operations within a CIM circuit to enable a higher throughput for dot-product operations, neuron activations or weight matrices while still providing higher performance and lower energy compared to continually moving data from memory for inputs in computations by a host processor. The CIM circuit includes a local memory processor to perform processing to return a computation result instead of merely returning raw or unprocessed data. In some examples, a processor in the CIM circuit computes a MAC value based on a charge or current from selected bitcells of a column of a memory array, the memory array also included in the CIM circuit. It will be noted that the abbreviation "MAC" can refer to multiply-accumulate, multiplication/accumulation, or multiplier accumulator, in general referring to an operation that includes the multiplication of two values, and the accumulation of a sequence of multiplications.

According to some examples, use of a CIM circuit in deep-learning applications reduces the amount of data that is typically transferred between system memory and compute resources. The reduction in data movement accelerates the execution of algorithms associated with deep-learning applications that may be memory bandwidth limited if not for the use of a CIM circuit. The reduction in data movement also reduces overall energy consumption associated with data movement within the computing device.

In some examples, processing elements of a CIM circuit may compute a MAC value via use of current summing for one or more columns of bitcells of an array included in the CIM circuit. For these examples, current summing may include doing the following: 1) multiple bitcell pass gates (PGs) simultaneously pulling down a pre-charged bitline of a column having accessed bitcells; and 2) interpret the final bitline voltage (VBL) as an analog output value. However, this current summing technique requires bitcell pull down paths to act as current sources, even as analog output values for VBL change. Also, an analog output value for VBL for a given column depends on stored states (e.g., number of 1's or 0's) for accessed bitcells of the given column. Variability in stored states for a relatively low number of bitcells (e.g., around 5 bitcells) due, at least in part, to velocity saturation voltage on multiple bitcell PGs may cause non-linearity in relation to changes in VBL for the various combinations of stored states. Non-linearity makes it difficult to predict analog output values for various combinations of stored states maintained in the given column. These difficult to predict analog output values due to non-linearity may result in limiting a VBL voltage range to a range that is somewhat linear. Limiting the VBL voltage range causes a reduction in resolution for interpreting a final VBL as an analog output value. A reduced resolution may result in less precision for predicting analog output values based on VBL when a number of bitcells accessed in the give column exceed a relatively low number (e.g., more than 5).

FIG. 1 illustrates an example system 100. In some examples, system 100 may represent a CIM block or a CIM circuit. For these examples, as shown in FIG. 1, system 100 includes memory 110. Memory 110 represents a memory circuit, which includes array 120 made up of multiple bitcells 122. Array 120 may be any size of memory array made up of any number of columns and any number of rows.

In one example, a number of bitcells per row is different than a number of bitcells per column.

Bitcell 122 is an example of a memory cell. The memory cell may be constructed in accordance with any of a variety of different technologies. As shown in FIG. 1, bitcell 122 may be situated at an intersection of a row with a column. In some examples, bitcell 122 may be constructed as a static random access memory (SRAM) bitcell. For these examples, bitcell 122 may represent a 6-transistor (6T) SRAM bitcell, although examples are not limited 6T SRAM bitcells. In other examples, bitcell 122 may represent a memory cell constructed in accordance with a dynamic random access memory (DRAM) technology. In other examples, bitcell 122 may represent a memory cell constructed in accordance with a resistive-based random access memory (RAM) cell. Resistive-based RAM may include resistive-RAM (ReRAM), phase change memory (PCM), magnetoresistive RAM (MRAM), ferroelectric RAM (Fe-RAM), dielectric RAM, or other types of resistive-based memory.

According to some examples, bitcell 122 is connected to differential bitlines or column lines. In other examples, array 120 of memory 110 may have single-ended bitlines. In some usage scenarios, differential bitlines may improve signal integrity of sensing of a signal that indicates a stored state of bitcells 122. For example, for system 100 shown in FIG. 1, the bitline (BL) or column line is illustrated as BL, and the complementary signal by BL_# or bitline-bar.

In some examples, as shown in FIG. 1, memory 110 includes row decoders 130 to drive rows of array 120. The rows may be called wordlines. Also, as shown in FIG. 1, memory 110 includes precharge circuitry 140 to charge columns or bitlines of array 120. Row decoder 130 includes driver circuitry to apply charge to the rows or wordlines of array 120. According to some examples, precharge circuitry 140 may first charge columns/bitlines, and then row decoder 130 activates the rows/wordlines for access (e.g., a read access). As shown in FIG. 1, row decoder 130 may be able to select multiple rows/wordlines simultaneously. Simultaneous selection refers to charging the rows/wordlines together for a concurrent access to multiple rows/wordlines. FIG. 1 shows an example of selected rows 132 as rows/wordlines charged together for concurrent access. The other rows/wordlines of array 120 are shown in FIG. 1 as non-selected rows 134. When multiple rows/wordlines are selected together, the charge on the different rows/wordlines combines to perform the equivalent of a multiplication of the values in the rows for a column/bitline with an input value.

According to some examples, memory 110 provides either traditional memory access (e.g., read and write of specific addresses), as well as supporting a CIM operation. For these examples, access control for memory 110 may determine how to control row decoder 130 and precharge circuitry 140 for the different types of operation. The access control may refer to control circuitry in a processor or lower level memory circuit that accesses the memory for data. In one example, the processor can support a different instruction or control code to identify CIM operations. In one example, the processor specifically stores data in memory 110 instead of a lower level memory when the data will be used for CIM operations.

In a traditional memory access operation as opposed to a CIM operation, memory 110 includes precharge circuitry 140, multiplexers (muxes) 142, and sense amplifiers (amps) 144. Traditionally, sense amplifiers 144 have required so much physical space that multiple column/bitlines are multiplexed together with a mux 142. Outputs of the sense amplifiers are again multiplexed for the bus to the processor circuitry or arithmetic logic unit (ALU) circuitry. The traditional memory access operation results in a read out of word (W). As shown in FIG. 1, word W may include w[3:0] outputted from selected rows 132. With a traditional memory read, the stored data flows from array 120 to a digital processor separate from memory 110 for computation. The digital processor may be a host processor that operates on digital data. Traditional memory access operations are typically associated with von Neumann computing systems, which use a central processing unit (CPU) operating on data fetched from a memory unit. In some examples, the digital processor is a graphics processor or graphics processing unit (GPU). In other examples, the digital processor includes or is an ALU.

The traditional memory access operation does not perform well with data-intensive applications such as machine-learning (ML), which typically perform large amounts of data processing. The data is either stored on-chip in SRAM arrays or in off-chip DRAM memory. For these traditional memory access operations, a computing system fetches the data from the memory to feed into a digital host processor. This type of data for machine learning or deep learning is often referred to as weights. The digital host processor performs operations such as matrix-matrix multiplication, vector-matrix multiplication, element-wise operations, absolute difference computation, or other computation.

In some examples, as shown in FIG. 1, a CIM circuit such as the one included in system 100 includes an analog processor 150. For these examples, analog processor 150 is part of memory 110. Analog processor 150 may receive at least two inputs and performs one or more computations on these at least two inputs. The at least two inputs are w from array 120, and x to compute a function. In some examples, w may be referred to as a weight input and x may be referred to as an input activation. Thus, analog processor 150 produces output OUT=f(x,w). The function can be matrix multiplication, absolute difference computation, dot product multiplication, or other type of machine learning operation.

According to some examples, CIM circuits such as the one included in system 100 may be part of or arranged as a CIM accelerator to allow a digital processor to offload machine learning operations. CIM circuits can overcome possible communication and bandwidth limitations of traditional processing by embedding compute operations within memory 110. In some examples, the compute operations in memory 110 are directly performed on a data read from array 120 instead of transferring data read from array 120 to a digital processor. Performing compute operations in array 120 essentially configures the BLs to act as interconnects between bitcells 122 of array 120 and analog processor 150. For some examples, the computations happen based on a bitline voltage of a given bitline after the read operation that causes access to bitcells 122 of selected rows 132.

In some examples, a read operation for the CIM circuit included in system 100 may be referred to as a functional read (FR), because a read of selected bitcells of array 120 results in a functional output (OUT) from analog processor 150.

According to some examples, prior to a read operation, system 100 may cause a precharge of columns in array 120 to a memory supply voltage (VDD). When system 100 causes an activation of multiple row drivers, these precharged columns generate an expected current proportional to the values stored in the corresponding rows of the column. For these examples, the rows may be weighted by bit position weighted results based on a bitline voltage output from the column that is directly proportional to the binary stored word. For example, for the 4-bit word shown in system 100, assuming that $w_3$ is a most significant bit (MSB) and $w_0$ is a least significant bit (LSB), the total current discharge and the bitline voltage output from the column is proportional to $\{w_0+2*w_1+4*w_2+8*w_3\}$. A bitline voltage output from the column will vary based a bit pattern for the 4-bit word.

In some examples, analog processor 150 may be capable of sensing/determining a bitline voltage output from a column based sampling capacitance. System 100 does not have to include capacitors for analog processor 150 to sense/determine a bitline voltage, rather the sensing/determining may be based on the capacitance of the bitline itself.

Figure 2:
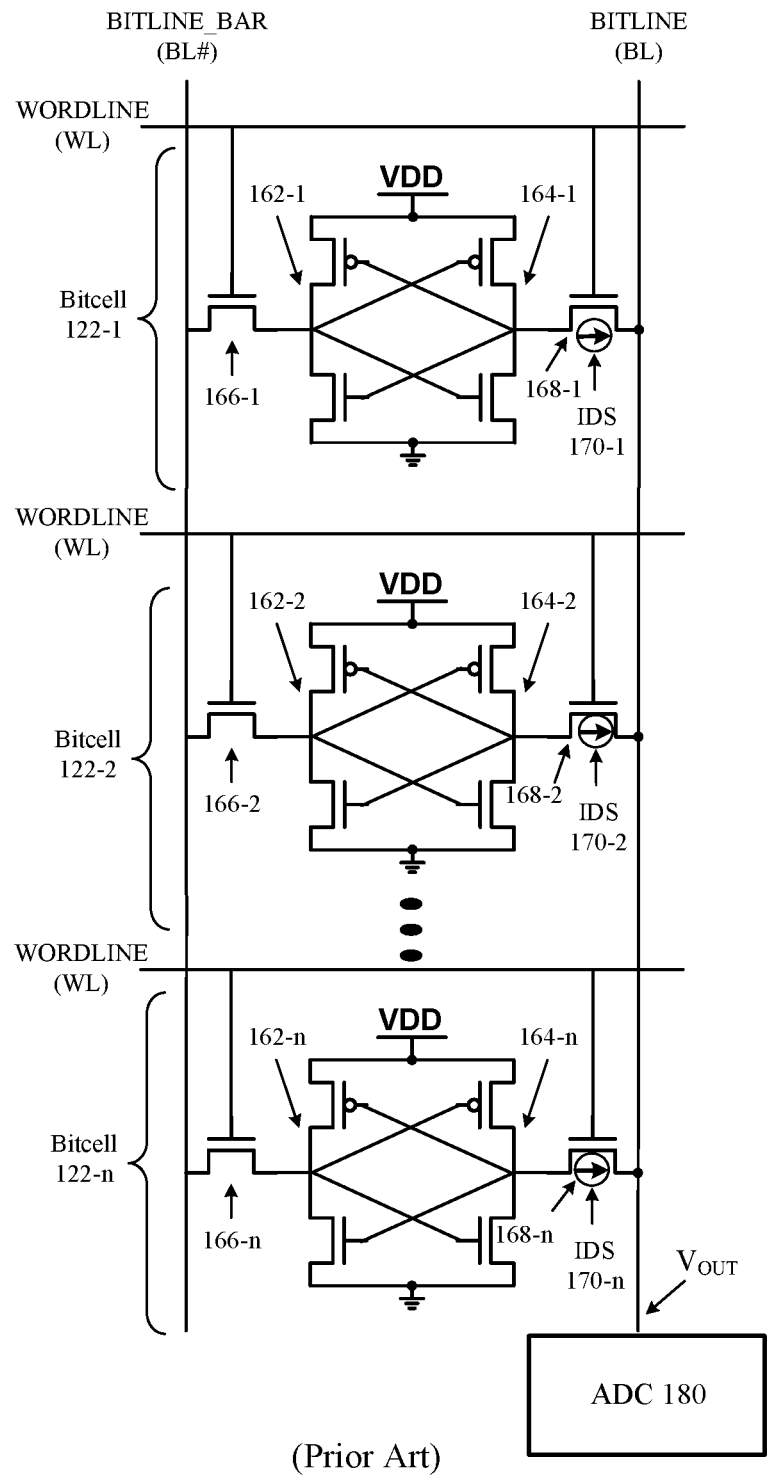
FIG. 2 illustrates an example first bitcell column.

FIG. 2 illustrates an example bitcell column 200. According to some examples, bitcell column 200 may represent a prior art configuration of a column of bitcells that separately include six transistors (6T). For these examples, bitcell column 200 may be arranged to facilitate computations with current summing to determine a bitline voltage at $V_{out}$. As shown in FIG. 2, bitcells 122-1 to 122-n (where "n" represents any whole positive integer>1) are arranged in bitcell column 200 such that when at least a portion of these bitcells are selected, an analog bitline voltage at $V_{out}$ is produced. The analog bitline voltage may be converted to a digital value using an analog to digital converter (ADC) 180. Bitcells 122-1 to 122-n may alternatively be referred to as storage cells. Transistors included in bitcells 122-1 to 122-n may be metal oxide semiconductor field effect transistors (MOSFETs) or other types of transistors. Transistors 166 and 168 included in respective bitcells 122-1 to 122-n may represent access transistors that control access to selected bitcells during read and write operations.

According to some examples, transistors 166 and 168 are turned on whenever a wordline (WL) is activated for read or write operations and thus connecting activated bitcells from among bitcells 122-1 to 122-n to the complementary bitlines (BL#, BL). When a given WL is not activated, access transistors 166 and 168 are turned off and the data is retained in those bitcells from among bitcells 122-1 to 122-n coupled to the given WL. Bitcells 122-1 to 122-n, as shown in FIG. 2, separately include cross-coupled inverters 162 and 164. Inverters 162 and 164 separately included in bitcells 122-1 to 122-n may form a latch that stores or holds a bit value as long as bitcells 122-1 to 122-n are powered. As shown in FIG. 2, each cross-coupled inverter may include a PMOS (P-channel MOSFET) transistor coupled to VDD, and an NMOS (N-channel MOSFET) transistor coupled to ground. For example, the source of the PMOS included in invertor 162-1 and the drain of the PMOS included in invertor 164-1 are coupled to VDD. Also, the drain of the NMOS included in invertor 162-1 and the source of the NMOS included in invertor 164-1 are coupled to ground.

In some examples, gates of inverter 162 are controlled by transistor 168, and are thus driven when transistor 168 is on (which is driven by the WL), and which are coupled to the output of inverter 164. Also, the gates of inverter 164 are controlled by the state of transistor 166, and which in turn are coupled to the output of inverter 162. Individual bitcells from among bitcells 122-1 to 122-n have two stable states which are used to individually store a logic 0 or logic 1. When transistors 166 and 168 are on, the gates of inverters 162 and 164 are controlled by the bit value on the bitlines. When transistors 166 and 168 are off, inverters 162 and 164 each drive the other to hold its value.

According to some examples, a CIM operation implemented using prior art bitcell column 200 may generate an analog bitline voltage at $V_{out}$. For these examples, the CIM operation may perform an accumulation of several 1 bit (b) multiplies using a shared bitline. An example equation that may be implemented is $y=\Sigma w*x$. Weight values (w) are stored in bitcell column 200. Input activations (x) are driven onto a WL in selective rows of array 120 that includes bitcell column 200. Separate bitcells from among bitcells 122-1 to 122-n perform a 1 b multiplication of $w*x$. Then a summation is performed by summing respective currents (IDS) 170-1 to 170-n passing through open transistors 168-1 to 168-n and onto the shared bitline. For these examples, if individual bitcells from among bitcells 122-1 to 122-n act as an ideal current source, then the bitline voltage at $V_{out}$ may be determined as $V_{out}=VDD-m*IDS(w,x)/CBL$, where m represents a number of bitcells accessed on the bitline, and CBL is a total bitline capacitance. Thus, a bitline voltage determination at $V_{out}$ is proportional to a 1 b scalar product of the weight (w) and input activations (x). A sensed analog bitline voltage value of $V_{out}$ may be converted to a digital value using ADC 180. This digital value may then be used in digital processing for deep learning or other types of machine learning algorithms.

Non-idealities in memory readout will likely cause at least some of the bitcells included in bitcells 122-1 to 122-n to not behave as ideal current sources. For the 6T bitcells shown in FIG. 2, sources of variation may include, but are not limited to, IDS dependency on pass gate drain source voltage (VDs) or pass gate pull up after the bitline is partially discharged. During a CIM read operation involving bitcell column 200, a bitline voltage is discharged by accessed bitcells from among bitcells 122-1 to 122-n. As the bitline voltage approaches and drops below a transistor velocity saturation voltage ($V_{DSAT}$), IDS becomes dependent on the bitline voltage and the IDS drops in value. This effect is dependent on a maximum bitline voltage swing, which in turn is determined by weights (w) stored in accessed bitcells from among bitcells 122-1 to 122-n. As the bitline voltage drops, bitcells storing a '1' value will pull up the bitline through their respective pass gates. Both of these effects will make expected or predicted voltage values for different storage states in bitcells 122-1 to 122-n to be unequally spaced and non-linear. Some predicted voltage values may have smaller voltage differences (low resolution) than in an ideal case, making some voltage values difficult to determine from sensed bitline voltages at $V_{out}$.

Figure 3:
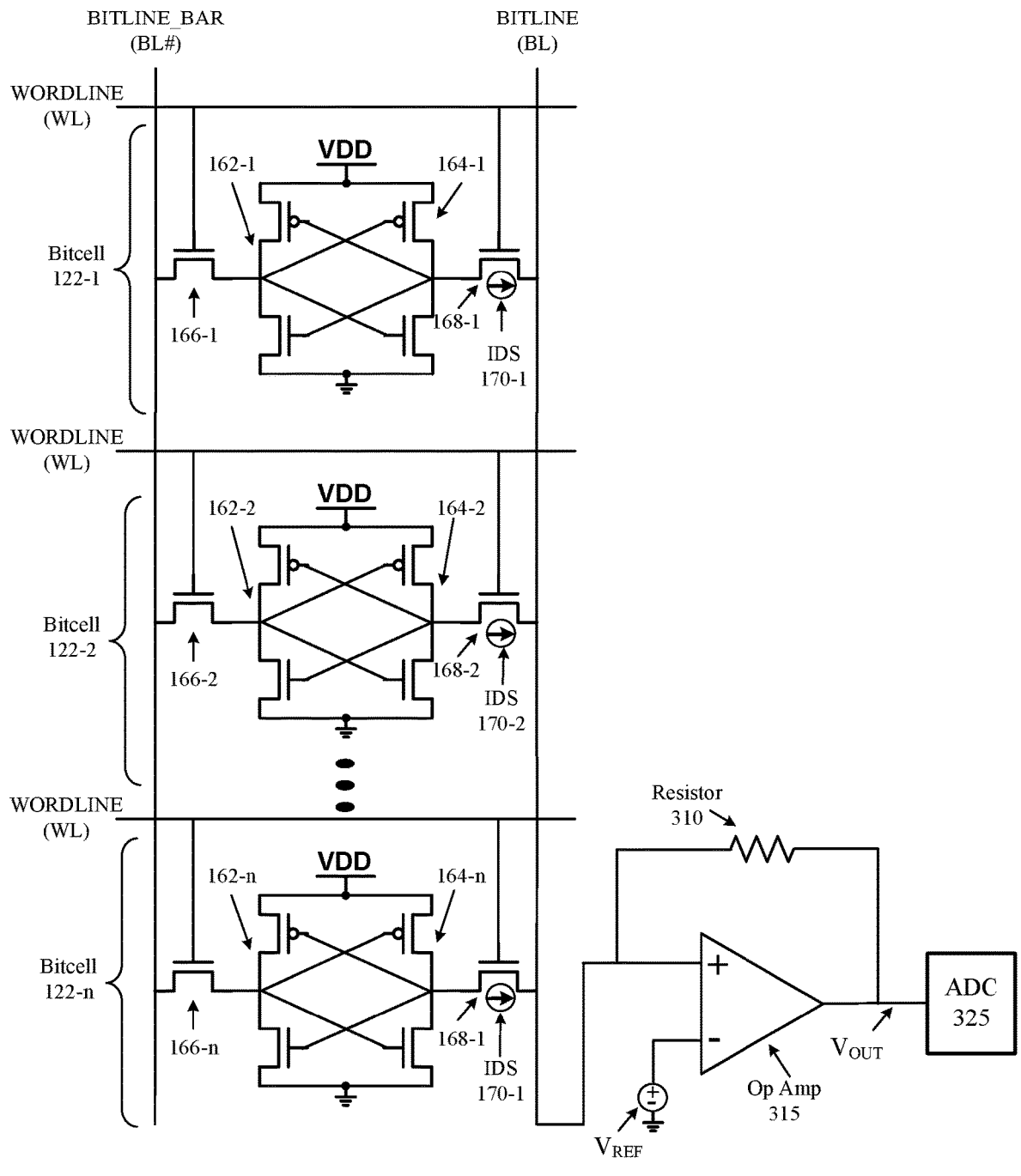
FIG. 3 illustrates an example second bitcell column.

FIG. 3 illustrates an example bitcell column 300. In some examples, bitcell column 300 may represent an improvement to bitcell column 200 shown in FIG. 2. For these examples, similar to bitcell column 200, bitcell column 300 includes 6T bitcells 122-1 to 122-n. However, different from bitcell column 200, bitcell column 300 includes an operational amplifier (Op Amp) 315 and a resistance device 310 coupled to the bitline. This improvement to bitcell column 200 shown in FIG. 3 as bitcell column 300 causes bitcells 122-1 to 122-n to act more like ideal current sources. Also, rather than using a voltage-based readout technique as described above for bitcell column 200, bitcell column 300 uses a current-sensing readout technique. As in the voltage-sensing technique, multiple bitcells share a bitline and may be conditionally/selectively and simultaneously accessed. However, the bitline voltage is driven by Op Amp 315 and held at a reference voltage ($V_{REF}$). Driving the bitline voltage by Op Amp 315 and holding that bitline voltage at $V_{REF}$ may set an operating condition for individual bitcell pass gates for bitcells 122-1 to 122-n to readout at a particular $V_{DS}=V_{REF}$. Thus, independent of or regardless of weight content stored in bitcells 122-1 to 122-n (e.g., numbers of '1' or '0' states), and throughout a CIM read operation, a bitcell from among bitcells 122-1 to 122-n operates at a fixed point that delivers a current that may be substantially constant.

According to some examples, resistance device 310 may be either an active or passive type of resistance device. In an example where resistance device 310 is an active device, resistance device 310 may be a PMOS or NMOS type transistor coupled with a supply voltage (not shown) to enable some adjusting to a resistance value for resistance device 310 compared to a set resistance for a passive type resistance device such as a resistor.

Figure 4:
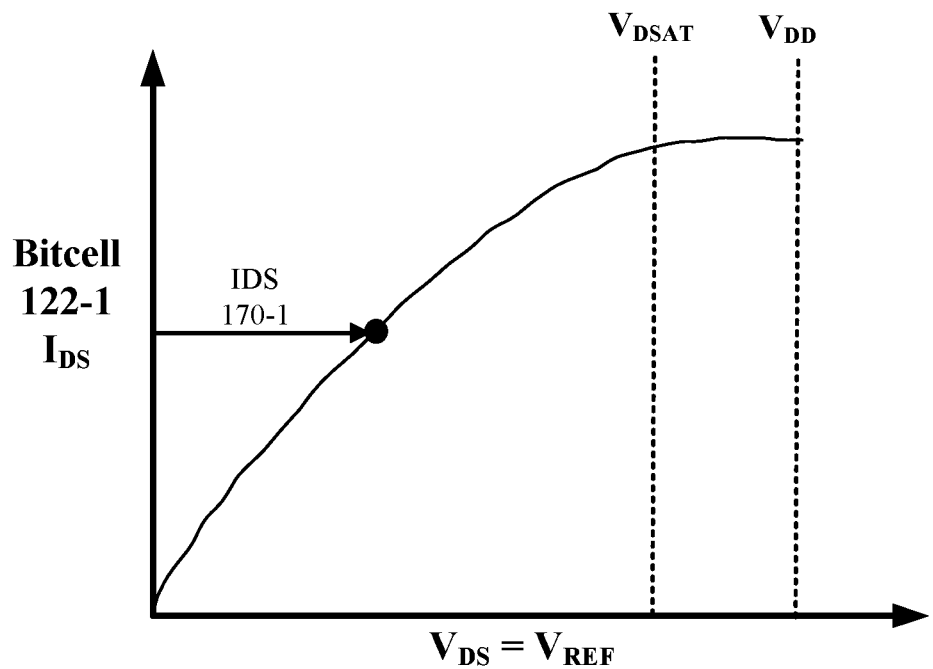
FIG. 4 illustrates an example plot.

FIG. 4 illustrates an example plot 400. According to some examples, the set operation condition for bitcell pass gates for a bitcell such as bitcell 122-1 readout at a particular $V_{DS}=V_{REF}$ is shown in plot 400. The point for IDS 170-1 represents how bitcell 122-1 may operate at a fixed point in plot 400 when the bitline voltage is driven by Op Amp 315 that is held at $V_{REF}$.

According to some examples, a readout current from the bitline of bitcell column 300 is converted to a voltage by Op Amp 315. Example equations for determining an analog voltage value for a bitline voltage at $V_{out}$ for the configuration of bitcell column 300 shown in FIG. 3 may be written as follows:

$$\frac{V_{Out} - V_{REF}}{R} = IDS * \sum wx \quad (1)$$

$$V_{Out} = R * IDS * \sum wx + V_{REF} \quad (2)$$

In some examples, since current represented by IDS 170-1 to 170-n of respective bitcells 122-1 to 122-n are sourced by Op Amp 315 and sunk by these bitcells, $V_{REF}$ coupled to Op Amp 315 may be set at an intermediate voltage value between VDD and ground (GND). The value for R is the resistance value for resistance device 310 coupled between the bitline of bitcell column 300 and the output of Op Amp 315. For these examples, IDS for example equation (2) may be a difference between a current from a bitcell storing a state or bit value of '0' and a bitcell storing a state or bit value of '1'. For example equations (1) and (2), w represents individual weight content stored in selected bitcells and x represents input activation values for the selected bitcells.

According to some examples, individual currents for bitcells storing state '0' may be in a reverse direction to the arrows shown in FIG. 3 for IDS 170-1 to 170-n. A sensed analog voltage at $V_{OUT}$ may be converted to a digital value using ADC 325 and the digital value used in digital processing for deep learning or other types of machine learning algorithms. In some examples, ADC 325 may be part of an analog processor included in processing circuitry. The analog processor may capable of sensing the analog voltage at $V_{OUT}$, convert that sensed analog voltage to the digital value and use the digital value to compute a MAC value.

Although a 6T bitcell is shown in FIG. 3 for the above-described current-sensing readout technique, other configurations of bitcells are possible that may include more or less transistors. Also, examples are not limited to SRAM types of memory for this current-sensing readout technique. Other types of memory such as resistive types of memory arranged in crossbar style configuration may use a similar current-sensing readout technique.

Figure 5:
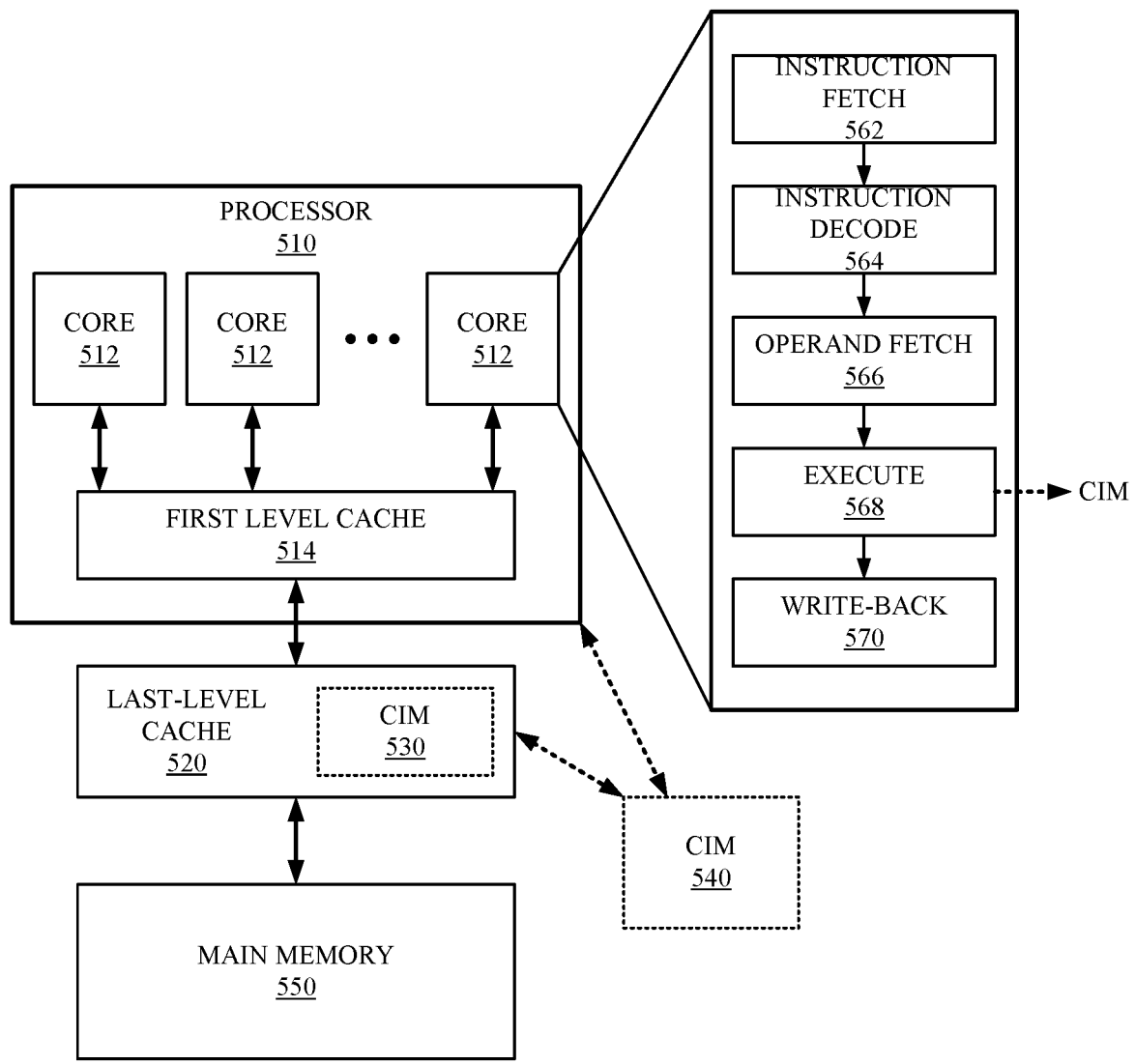
FIG. 5 illustrates an example second system.

FIG. 5 illustrates an example system 500. In some examples, system 500 includes a processor 510 that include or is coupled with a CIM circuit in accordance with any example described above. The CIM circuit may be a CIM accelerator for machine learning or other compute-intensive operation. In some examples, an accelerator may be referred to as a coprocessor. In some examples, the CIM circuit may provide at least a portion of a neural network infrastructure for computation of an artificial intelligence application.

According to some examples processor 510 may be or include a general purpose CPU (central processing unit), a GPU (graphics processing unit), a DSP (digital signal processor) array, or other processor. Processor 510 may represent a digital processor and may be referred to as a host processor. In some examples, as shown in FIG. 5, processor 510 includes multiple cores 512. Processor 512 may execute applications or software programs that access data for compute-intensive operations.

In some examples, processor 510 includes first level cache 514, which represents caching resources within a same die or system on a chip/package (SOC/SOP) that provides physically close storage resources for hot data. Processor 510 may include multiple levels of on-chip/local cache, which are not explicitly shown. It will be understood that cache resources can be local to a specific core 512, shared by multiple cores 512, or a combination of shared cache resources and localized cache resources.

System 500 includes last level cache 520. In some examples, last level cache 520 is also located on a on a same die or SOC/SOP. In other examples, last level cache 520 may be off-chip or located off an SOC/SOP in relation to processor 510. In some examples, last level cache 520 may be substantially larger than first level cache 514 but may have a relatively longer access latency compared to first level cache 514. There may be any number of other cache layers between first level cache 514 and last level cache 520.

According to some examples, main memory 550 represents system main memory. Main memory 550 may be orders of magnitude larger in memory capacity compared to a memory capacity of cache resources that include first level cache 514 and last level cache 520. However, main memory 550 may have a relatively longer access latency compared to these cache resources. Main memory 550 may include volatile types of memory that have indeterminate state when power is interrupted. Main memory 550 may include non-volatile types of memory resources that maintain state even when power is interrupted to the memory. Caching resources typically include volatile types of memory but may also include nonvolatile types of memory.

As shown in FIG. 5, system 500 includes a depiction of an instruction execution pipeline for core 512. In some examples, each core 512 may include multiple execution pipelines (e.g., multithreading). The instruction pipeline is to be understood as a general explanation, and specific details are not provided. In one example, the instruction pipeline includes instruction fetch 562 where the core fetches the instruction to execute. Instruction decode 564 represents the decoding of the instruction by the core in preparation of the processor circuitry for execution. In one example, instruction decode 564 identifies the instruction as part of a command that triggers use of a CIM circuit for operation.

Operand fetch 566 represents the fetching or obtaining of the operands to be executed on for the instruction. In some examples, the operand is a weight vector for a neural network, or other math function operand. In some examples, the operands are in or are placed in register space associated with the execution pipeline. Execute 568 represents execution of the instruction on or with the operand(s). In some examples, execution can include sending of the operation to a CIM circuit for execution. In some examples, the instruction is sent to a processor ALU, which can trigger the execution by a CIM circuit arranged as a CIM accelerator. Write-back 570 refers to writing execution results in a results register for return to memory, or for passing to another register for another execution. In the case of use of the CIM circuit, execution 568 and write-back 570 can include sending the operation to the CIM circuit, which will execute the operation and return a functional output, which can then be written back. Thus, the instruction that would traditionally require loading operands into an ALU or other computation engine within processor 510 can be sent to the CIM circuit without having to read from memory, and then receiving a computation result from the CIM circuit instead of from the local computation engine.

CIM 530 represents a CIM circuit implemented in last level cache 520. CIM 530 can be all or part of last level cache 520. In some examples, last level cache 520 includes a memory array configured as a CIM circuit, and also includes a separate memory array that does not include CIM circuitry or a CIM circuit. For these examples, system 500 may be able to selectively store data in the memory array configured as a CIM circuit for CIM acceleration.

According to some examples, CIM 540 represents a CIM circuit that is separate from the cache architecture of system 500. For these examples, CIM 540 represents a memory resource that is dedicated to the execution of CIM accelerated operations. Similar to memory 110 described above for FIG. 1, such a CIM memory may still include traditional access hardware to enable reading from the memory without performing a computation. CIM 530 and CIM 540 include CIM hardware to enable functional reads in accordance with any example described herein.

In some examples, CIM 530 and CIM 540 include access paths from processor 510. When part of the cache architecture includes CIM 530, the interconnection hardware may be the same as interconnection hardware for the cache devices. When not part of the cache architecture, the CIM interconnection can be similar or the same as a cache device, or main memory device, or other memory coupled to processor 510. CIM 530 and CIM 540 may be coupled to main memory 550 via access paths (not specifically shown) to load operands for CIM acceleration operations.

In some examples, invocation of a compute-intensive function triggers directing commands to CIM 530 or CIM 540 arranged as a CIM accelerator. For example, processor 510 may include support in its instruction set architecture (ISA) for certain commands to trigger operation of the CIM accelerator. Invocation of the CIM accelerator may be preceded by or associated with the loading of configuration information into the CIM accelerator. Such configuration information can, for example, define weights of internodal connections, define math functions to be performed, or other types of configuration information. Elements of system 500 may be able to load configuration information from main memory 550 or from nonvolatile mass storage (not shown), or a combination.

According to some examples, CIM 530 or CIM 540, or both, may include one or more levels of a neural network. For these examples, after configuration of the CIM 530 or CIM 540, an instruction pipeline may cause input values to be sent to CIM 530 or CIM 540 for processing. CIM 530 or CIM 540 may generate a result to write back to a register space or main memory 550 and CIM 530 or CIM 540 may indicate completion of the processing to the executing thread that invoked CIM 530 or CIM 540. In some examples, if a number of neural network levels or neurons per level that are physically implemented in CIM 530 or CIM 540 is less than the number of levels/neurons of the neural network to be processed, the processing through the neural network can be iterated by repeatedly loading the CIM 530 or CIM 540 for processing until all levels of the neural network have been processed.

Figure 6:
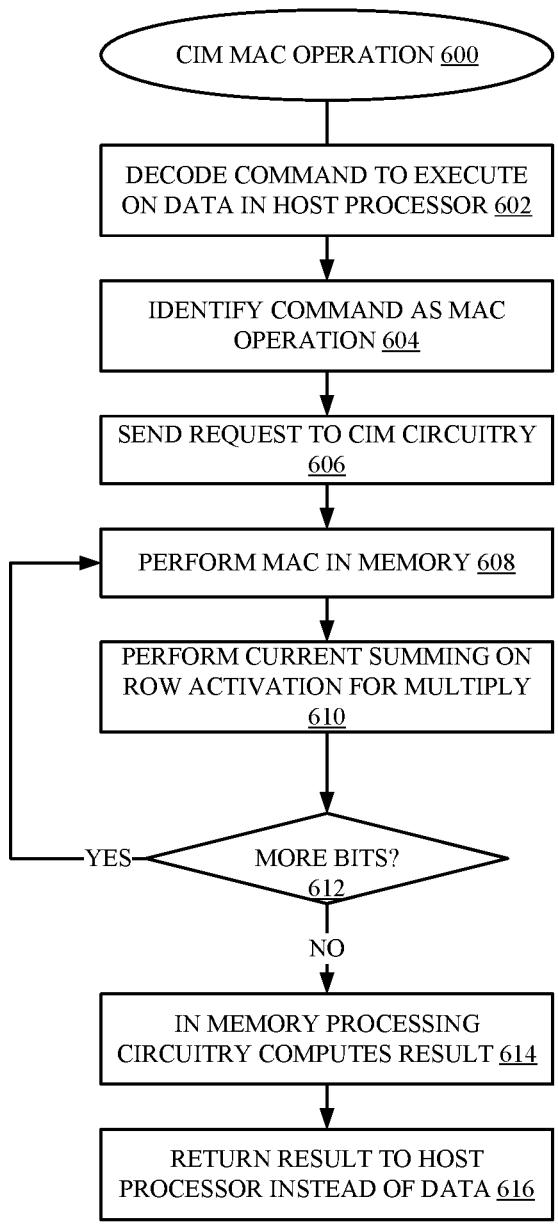
FIG. 6 illustrates an example logic flow.

FIG. 6 illustrates an example logic flow. According to some examples, the logic flow may represent an example logic flow for a process 600 associated with a compute-in-memory operation. For example, process 600 may be for a CIM MAC operation by an example system with one or more CIM circuits in accordance with what is described herein. For these examples, a processor or control logic for the processor may decode a command for execution of an instruction on data, block 602. In some examples, the processor identifies the command as a MAC operation, block 604. While a MAC operation is specifically described, it will be understood that the operation could alternatively be any operation involving compute-intensive operations that may be accelerated with a CIM circuit from among the one or more CIM circuits. The CIM circuit may be capable of accelerating any operation that involves multiply or accumulate operations, or both, with many sequential computations.

In some examples, for an identified MAC operation, the processor sends a request with the instruction to the CIM circuit, block 606. The CIM circuit performs the operation as an iteration of multiple computations, starting at block 608.

According to some examples, the CIM circuit may be arranged to perform a current-sensing readout technique as mentioned above for bitcell column 300 shown in FIG. 3 in order to convert an analog voltage output from the local bitlines of an array included in the CIM circuit responsive to a row activation for a multiply operation, block 610. In some examples, the current-sensing readout technique may occur responsive to the activation of one or more rows of the array.

In some examples, after the computation operation(s), if there are more bits to process in the operand of the instruction, block 612 YES branch, process 600 returns to block 608 for another iteration. If there are no more bits to process, block 612 NO branch, in memory processing circuitry may finalize a result, block 614. In some examples, the processing circuitry may include an analog processor to sense an analog voltage, convert the analog voltage to a digital value and perform operations on digital values generated based on conversion of sensed analog voltages for local bitlines of the array. In some examples, the analog processor included in the processing circuitry may sense an analog voltage output from a given bitline, convert the analog voltage to a digital value, and perform shift operations on the digital value. Eventually the analog processor converts all sensed analog voltages output from bitlines of a memory array to digital values and these digital values may be returned as a result. For these examples, the analog processor includes analog circuitry to sense the analog voltage and one or more digital processing blocks to convert the sensed analog voltage to a digital value to compute a MAC value. The analog processor included in the processing circuity may then return a functional read result to the processor that invoked the CIM circuit, instead of returning data for computation by the processor, block 616.

Figure 7:
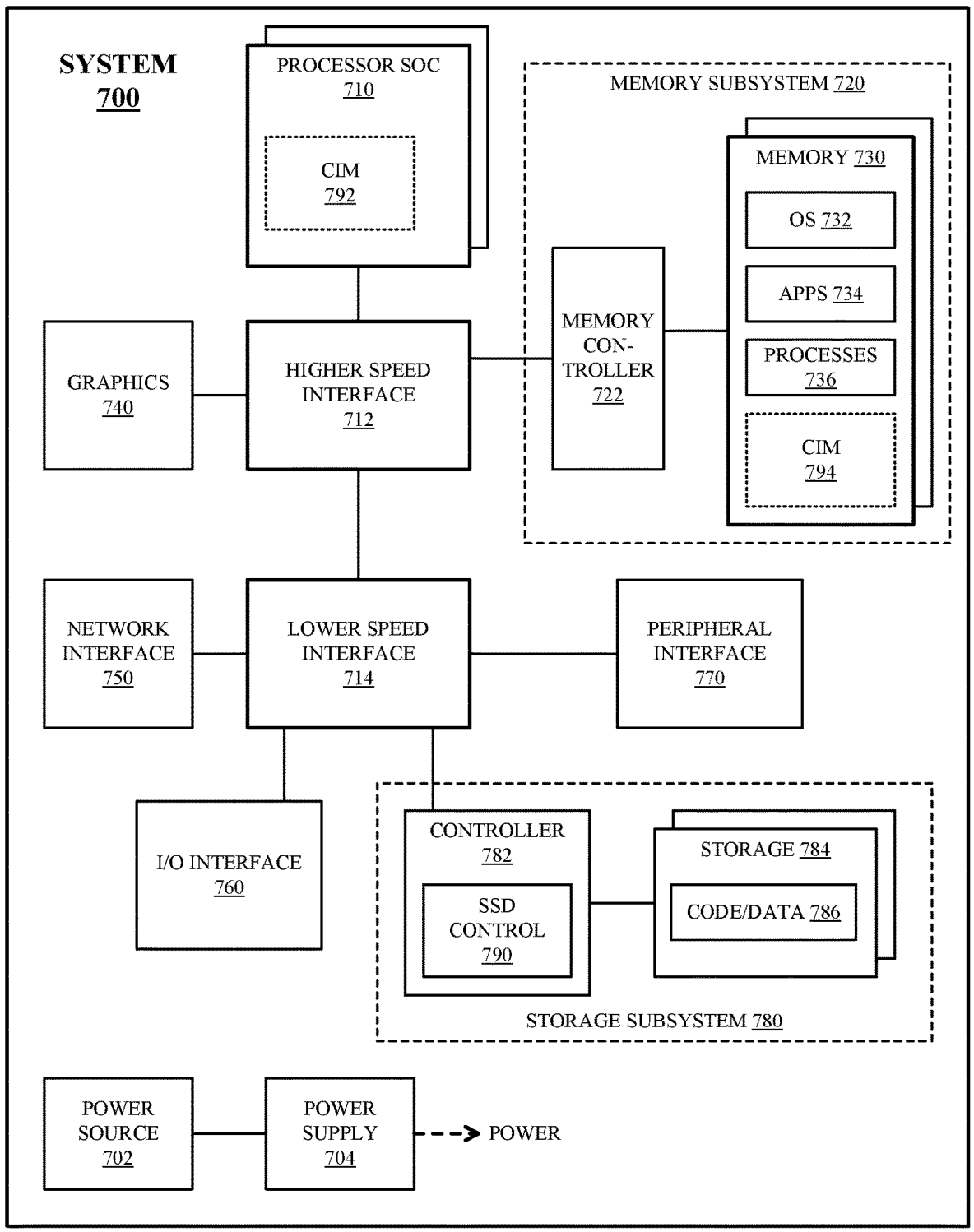
FIG. 7 illustrates an example third system.

FIG. 7 illustrates an example system 700. In some examples, system 700 may be a computing system in which compute-in-memory (CIM) operations may be implemented. System 700 represents a computing device in accordance with any example herein, and can be a laptop computer, a desktop computer, a tablet computer, a server, a gaming or entertainment control system, a scanner, copier, printer, routing or switching device, embedded computing device, a smartphone, a wearable device, an internet-of-things device or other electronic device.

According to some examples, system 700 includes one or more CIM circuits. The one or more CIM circuits may be in accordance with any example described herein. An example of a CIM circuit may be CIM 792, which is represented as a CIM circuit included in processor SOC 710. CIM 792 may be included in a memory device on the processor SOC substrate or die. For example, CIM 792 may be a cache or a portion of a cache on and for processor SOC 710. Another example of a CIM circuit may be CIM 794, which is represented as a CIM circuit included in memory subsystem 720. For this other example, CIM 794 is shown as part of memory 730, referring to the memory resources of system 700. CIM 794 represents a CIM circuit that may be included as a memory resource to which processor SOC 710 can offload compute-intensive operations. In some examples, the memory arrays of either CIM 792 or CIM 794 may be dedicated to storing data for CIM acceleration. In one example, CIM 792 or CIM 794 are used as regular memory resources and can also help with CIM acceleration.

System 700 includes processor SOC 710 (referred to subsequently as "processor 710"), which provides processing, operation management, and execution of instructions for system 700. Processor 710 can include any type of microprocessor, central processing unit (CPU), graphics processing unit (GPU), processing core, or other processing hardware to provide processing for system 700, or a combination of processors. Processor 710 controls the overall operation of system 700, and can be or include, one or more programmable general-purpose or special-purpose microprocessors, digital signal processors (DSPs), programmable controllers, application specific integrated circuits (ASICs), programmable logic devices (PLDs), or the like, or a combination of such devices.

In one example, system 700 includes interface 712 coupled to processor 710, which can represent a higher speed interface or a high throughput interface for system components that needs higher bandwidth connections, such as memory subsystem 720 or graphics interface components 740. Interface 712 represents an interface circuit, which can be a standalone component or integrated onto a processor die. Where present, graphics interface 740 interfaces to graphics components for providing a visual display to a user of system 700. In one example, graphics interface 740 can drive a high definition (HD) display that provides an output to a user. High definition can refer to a display having a pixel density of approximately 100 PPI (pixels per inch) or greater and can include formats such as full HD (e.g., 1080p), retina displays, 4K (ultra high definition or UHD), or others. In one example, the display can include a touchscreen display. In one example, graphics interface 740 generates a display based on data stored in memory 730 or based on operations executed by processor 710 or both. In one example, graphics interface 740 generates a display based on data stored in memory 730 or based on operations executed by processor 710 or both.

Memory subsystem 720 represents the main memory of system 700 and provides storage for code to be executed by processor 710, or data values to be used in executing a routine. Memory subsystem 720 can include one or more memory devices 730 such as read-only memory (ROM), flash memory, one or more varieties of random access memory (RAM) such as DRAM, or other memory devices, or a combination of such devices. Memory 730 stores and hosts, among other things, operating system (OS) 732 to provide a software platform for execution of instructions in system 700. Additionally, applications 734 can execute on the software platform of OS 732 from memory 730. Applications 734 represent programs that have their own operational logic to perform execution of one or more functions. Processes 736 represent agents or routines that provide auxiliary functions to OS 732 or one or more applications 734 or a combination. OS 732, applications 734, and processes 736 provide software logic to provide functions for system 700. In one example, memory subsystem 720 includes memory controller 722, which is a memory controller to generate and issue commands to memory 730. It will be understood that memory controller 722 could be a physical part of processor 710 or a physical part of interface 712. For example, memory controller 722 can be an integrated memory controller, integrated onto a circuit with processor 710.

While not specifically illustrated, it will be understood that system 700 can include one or more buses or bus systems between devices, such as a memory bus, a graphics bus, interface buses, or others. Buses or other signal lines can communicatively or electrically couple components together, or both communicatively and electrically couple the components. Buses can include physical communication lines, point-to-point connections, bridges, adapters, controllers, or other circuitry or a combination. Buses can include, for example, one or more of a system bus, a Peripheral Component Interconnect (PCI) bus, a HyperTransport or industry standard architecture (ISA) bus, a small computer system interface (SCSI) bus, a universal serial bus (USB), or an Institute of Electrical and Electronics Engineers (IEEE) standard 1394 bus.

In one example, system 700 includes interface 714, which can be coupled to interface 712. Interface 714 can be a lower speed interface than interface 712. In one example, interface 714 represents an interface circuit, which can include standalone components and integrated circuitry. In one example, multiple user interface components or peripheral components, or both, couple to interface 714. Network interface 750 provides system 700 the ability to communicate with remote devices (e.g., servers or other computing devices) over one or more networks. Network interface 750 can include an Ethernet adapter, wireless interconnection components, cellular network interconnection components, USB (universal serial bus), or other wired or wireless standards-based or proprietary interfaces. Network interface 750 can exchange data with a remote device, which can include sending data stored in memory or receiving data to be stored in memory.

In one example, system 700 includes one or more input/output (I/O) interface(s) 760. I/O interface 760 can include one or more interface components through which a user interacts with system 700 (e.g., audio, alphanumeric, tactile/touch, or other interfacing). Peripheral interface 770 can include any hardware interface not specifically mentioned above. Peripherals refer generally to devices that connect dependently to system 700. A dependent connection is one where system 700 provides the software platform or hardware platform or both on which operation executes, and with which a user interacts.

In one example, system 700 includes storage subsystem 780 to store data in a nonvolatile manner. In one example, in certain system implementations, at least certain components of storage 780 can overlap with components of memory subsystem 720. Storage subsystem 780 includes storage device(s) 784, which can be or include any conventional medium for storing large amounts of data in a nonvolatile manner, such as one or more magnetic, solid state, or optical based disks, or a combination. Storage 784 holds code or instructions and data 786 in a persistent state (i.e., the value is retained despite interruption of power to system 700). Storage 784 can be generically considered to be a "memory," although memory 730 is typically the executing or operating memory to provide instructions to processor 710. Whereas storage 784 is nonvolatile, memory 730 can include volatile memory (i.e., the value or state of the data is indeterminate if power is interrupted to system 700). In one example, storage subsystem 780 includes controller 782 to interface with storage 784. In one example controller 782 is a physical part of interface 714 or processor 710 or can include circuits or logic in both processor 710 and interface 714.

Power source 702 provides power to the components of system 700. More specifically, power source 702 typically interfaces to one or multiple power supplies 704 in system 700 to provide power to the components of system 700. In one example, power supply 704 includes an AC to DC (alternating current to direct current) adapter to plug into a wall outlet. Such AC power can be renewable energy (e.g., solar power) power source 702. In one example, power source 702 includes a DC power source, such as an external AC to DC converter. In one example, power source 702 or power supply 704 includes wireless charging hardware to charge via proximity to a charging field. In one example, power source 702 can include an internal battery or fuel cell source.

Figure 8:
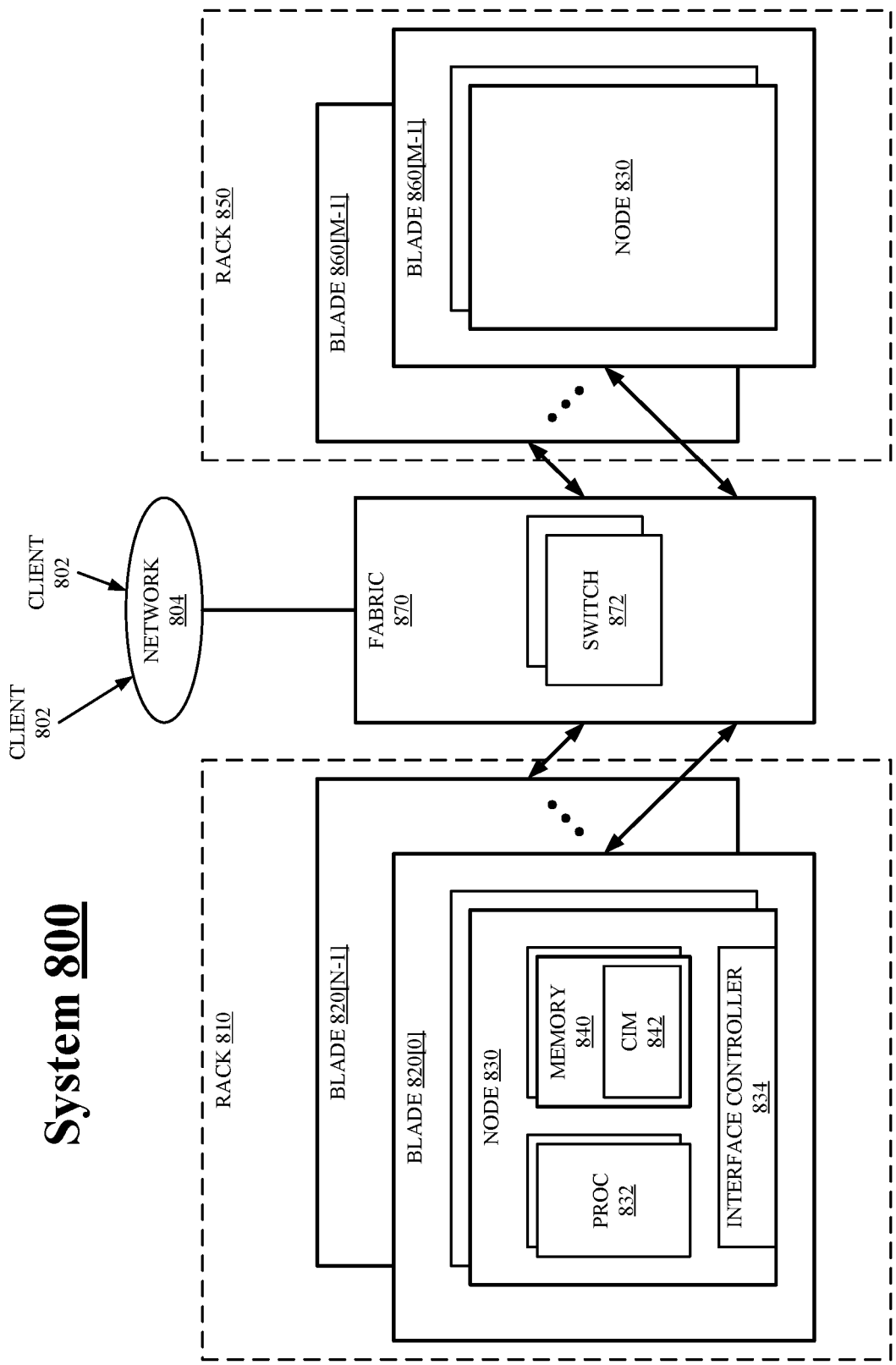
FIG. 8 illustrates an example fourth system.

FIG. 8 illustrates an example system 800. According to some examples, system 800 may be a multi-node network in which CIM operations may be implemented. System 800 represents a network of nodes in accordance with any example described herein. In some examples, system 800 may represent a data center, a server farm, a data cloud or a processing cloud.

In some examples, node 830 includes memory 840, which includes CIM 842. CIM 842 represents a CIM circuit in accordance with any description herein. With CIM 842, memory 840 may become a computation resource for node 830. More specifically, CIM 842 enables node 830 to provide improved processing of workloads that are both memory/data intensive as well as compute intensive. Instead of moving data back and forth from memory to processor, CIM 842 enables the memory to perform computations and return a functional result to the calling processor 832. CIM 842 may be implemented as a standalone resource within memory 840. In some examples, CIM 842 may be implemented as a cache on processor 832. In on some examples, CIM 842 may be located on a separate blade as an accelerator for a number of blade processor resources.

According to some examples, one or more clients 802 may make requests over network 804 to system 800. Network 804 represents one or more local networks, or wide area networks, or a combination. Clients 802 can be human or machine clients, which generate requests for the execution of operations by system 800. System 800 executes applications or data computation tasks requested by clients 802.

In some examples, system 800 includes one or more racks, which represent structural and interconnected resources to house and interconnect multiple computation nodes. In some examples, rack 10 includes multiple nodes 830. In some examples, rack 810 hosts multiple blade components 820. Hosting refers to providing power, structural support, mechanical support or localize interconnection. Blades 820 can refer to computing resources on printed circuit boards (PCBs), where a PCB houses the hardware components for one or more nodes 830. In some examples, blades 820 do not include a chassis or housing or other "box" other than that provided by rack 810. In some examples, blades 820 include housing with exposed connector to connect into rack 810. In some examples, system 800 does not include rack 810, and each blade 820 includes a chassis or housing that can stack or otherwise reside in close proximity to other blades and allow interconnection of nodes 830.

System 800 includes fabric 870, which represents one or more interconnectors for nodes 830. In some examples, fabric 870 includes multiple switches 872 or routers or other hardware to route signals among nodes 830. Additionally, fabric 870 can couple system 800 to network 804 for access by clients 802. In addition to routing equipment, fabric 870 can be considered to include the cables or ports or other hardware equipment to couple nodes 830 together. In some examples, fabric 870 has one or more associated protocols to manage the routing of signals through system 800. In some examples, the protocol or protocols is/are at least partly dependent on the hardware equipment used in system 800.

As illustrated, rack 810 includes N blades 820. In some examples, in addition to rack 810, system 800 includes rack 850. As illustrated, rack 850 includes M blades 860. M is not necessarily the same as N; thus, it will be understood that various different hardware equipment components could be used and coupled together into system 800 over fabric 870. Blades 860 can be the same or similar to blades 820. Nodes 830 can be any type of node and are not necessarily all the same type of node. System 800 is not limited to being homogenous, nor is it limited to not being homogenous.

For simplicity, only the node in blade 820[0] is illustrated in detail. However, other nodes in system 800 can be the same or similar. At least some nodes 830 are computation nodes, with processor (proc) 832 and memory 840. A computation node refers to a node with processing resources (e.g., one or more processors) that executes an operating system and can receive and process one or more tasks. In some examples, at least some nodes 830 are server nodes with a server as processing resources represented by processor 832 and memory 840. A storage server refers to a node with more storage resources than a computation node, and rather than having processors for the execution of tasks, a storage server includes processing resources to manage access to the storage nodes within the storage server.

In some examples, node 830 includes interface controller 834, which represents logic to control access by node 830 to fabric 870. The logic can include hardware resources to interconnect to the physical interconnection hardware. The logic can include software or firmware logic to manage the interconnection. In some examples, interface controller 834 is or includes a host fabric interface, which can be a fabric interface in accordance with any example described herein.

Processor 832 can include one or more separate processors. Each separate processor can include a single processing unit, a multicore processing unit, or a combination. The processing unit can be a primary processor such as a CPU (central processing unit), a peripheral processor such as a GPU (graphics processing unit), or a combination. Memory 840 can be or include memory devices and a memory controller.

Reference to memory devices can apply to different memory types. Memory devices generally refer to volatile memory technologies. Volatile memory is memory whose state (and therefore the data stored on it) is indeterminate if power is interrupted to the device. Nonvolatile memory refers to memory whose state is determinate even if power is interrupted to the device. Dynamic volatile memory requires refreshing the data stored in the device to maintain state. One example of dynamic volatile memory includes DRAM (dynamic random access memory), or some variant such as synchronous DRAM (SDRAM). A memory subsystem as described herein may be compatible with a number of memory technologies, such as DDR3 (dual data rate version 3, original release by JEDEC (Joint Electronic Device Engineering Council) on Jun. 27, 2007, currently on release 21), DDR4 (DDR version 4, initial specification published in September 2012 by JEDEC), DDR4E (DDR version 4, extended, currently in discussion by JEDEC), LPDDR3 (low power DDR version 3, JESD209-3B, August 2013 by JEDEC), LPDDR4 (LOW POWER DOUBLE DATA RATE (LPDDR) version 4, JESD209-4, originally published by JEDEC in August 2014), WIO2 (Wide I/O 2 (WideIO2), JESD229-2, originally published by JEDEC in August 2014), HBM (HIGH BANDWIDTH MEMORY DRAM, JESD235, originally published by JEDEC in October 2013), DDR5 (DDR version 5, currently in discussion by JEDEC), LPDDR5 (currently in discussion by JEDEC), HBM2 (HBM version 2), currently in discussion by JEDEC), or others or combinations of memory technologies, and technologies based on derivatives or extensions of such specifications.

In addition to, or alternatively to, volatile memory, in some examples, reference to memory devices can refer to a nonvolatile memory device whose state is determinate even if power is interrupted to the device. In some examples, the nonvolatile memory device is a block addressable memory device, such as NAND or NOR technologies. Thus, a memory device can also include a future generation nonvolatile devices, such as a three dimensional crosspoint (3DXP) memory device, other byte addressable nonvolatile memory devices, or memory devices that use chalcogenide phase change material (e.g., chalcogenide glass). In some examples, the memory device can be or include multi-threshold level NAND flash memory, NOR flash memory, single or multi-level phase change memory (PCM) or phase change memory with a switch (PCMS), a resistive memory, nanowire memory, ferroelectric transistor random access memory (FeTRAM), magnetoresistive random access memory (MRAM) memory that incorporates memristor technology, or spin transfer torque (STT)-MRAM, or a combination of any of the above, or other memory.

The follow examples pertain to additional examples of technologies disclosed herein.

Example 1

An example memory circuit having a memory array may include row access circuitry to drive multiple rows for selected bitcells of the memory array. The memory circuit may also include column access circuitry to drive a bitline coupled with the selected bitcells. The memory circuit may also an operational amplifier having a first input coupled with the bitline and a second input coupled with a reference voltage, an output of the operational amplifier coupled to a resistance device that is also coupled to the bitline. The operational amplifier may cause the selected bitcells to output a current independent of a state stored in the selected bitcells. The memory circuit may also include processing circuitry to include an analog processor to sense an analog voltage output from the operational amplifier and convert the analog voltage to a digital value to compute a MAC value.

Example 2

The memory circuit of example 1, the memory array may include 6T SRAM bitcells at intersections of the rows with the bitline.

Example 3

The memory circuit of example 2, the 6T SRAM bitcells may include a first and second cross-coupled inventors that may separately include a P-channel MOSFET and an N-channel MOSFET. The P-channel MOSFETs may be coupled to a supply voltage (VDD) and the N-channel MOSFETs coupled to ground.

Example 4

The memory circuit of example 3, the reference voltage may be set to an intermediate voltage value that falls between a voltage value for VDD and ground.

Example 5

The memory circuit of example 1, wherein the memory array includes resistive-based random access memory (RAM) bitcells at intersections of the rows with the bitline.

Example 6

The memory circuit of example 1, the resistance device may include an active resistance device that includes a P-channel MOSFET or an N-channel MOSFET.

Example 7

The memory circuit of example 6 may also include a gate for the P-channel MOSFET or the N-channel MOSFET coupled to a source voltage, the source voltage to set a resistance value for the active resistance device.

Example 8

The memory circuit of example 1, the resistance device may be a passive resistance device that includes a resistor.

Example 9

The memory circuit of example 1, to convert the analog voltage to the digital value to compute the MAC value may include determining an analog voltage value $V_{out}$ based on $V_{Out} = R*IDS*\Sigma wx + V_{REF}$, where R is a resistance value for the resistance device, IDS is a difference between a current from a bitcell from among the selected bitcells storing a bit value of 1 and the bitcell storing a bit value of 0, w is a weight stored to individual bitcells from among the selected bitcells, x is an input activation for the individual bitcells and $V_{REF}$ is the reference voltage coupled with the second input of the operational amplifier.

Example 10

An example system may include a host processor and a compute-in-memory (CIM) circuit. The CIM circuit may include a memory array. The CIM circuit may also include row access circuitry to drive multiple rows for selected bitcells of the memory array. The CIM circuit may also include column access circuitry to drive a bitline coupled with the selected bitcells. The CIM circuit may also include an operational amplifier having a first input coupled with the bitline and a second input coupled with a reference voltage. An output of the operational amplifier may be coupled to a resistance device that is also coupled to the bitline. The operational amplifier may cause the selected bitcells to output a current independent of a state stored in the selected bitcells. The CIM circuit may also include processing circuitry to include an analog processor to sense an analog voltage output from the operational amplifier and convert the analog voltage to a digital value to compute a MAC value.

Example 11

The system of example 10, the memory array may include 6T SRAM bitcells at intersections of the rows with the bitline.

Example 12

The system of example 11, the 6T SRAM bitcells may include a first and second cross-coupled inventors that separately include a P-channel MOSFET and an N-channel MOSFET, the P-channel MOSFETs coupled to VDD and the N-channel MOSFETs coupled to ground.

Example 13

The system of example 12, the reference voltage may be set to an intermediate voltage value that falls between a voltage value for VDD and ground.

Example 14

The system of example 10, the memory array may include resistive-based RAM bitcells at intersections of the rows with the bitline.

Example 15

The system of example 10, the resistance device may include an active resistance device that includes a P-channel MOSFET or an N-channel MOSFET.

Example 16

The system of example 15, a gate for the P-channel MOSFET or the N-channel MOSFET may be coupled to a source voltage, the source voltage to set a resistance value for the active resistance device.

Example 17

The system of example 10, the resistance device may include a passive resistance device that includes a resistor.

Example 18

The system of example 10, to convert the analog voltage to the digital value to compute the MAC value may include determining an analog voltage value $V_{out}$ based on $V_{Out}=R*IDS*\Sigma wx+V_{REF}$, where R is a resistance value for the resistance device, IDS is a difference between a current from a bitcell from among the selected bitcells storing a bit value of 1 and the bitcell storing a bit value of 0, w is a weight stored to individual bitcells from among the selected bitcells, x is an input activation for the individual bitcells and $V_{REF}$ is the reference voltage coupled with the second input of the operational amplifier.

Example 19

The system of example 10, the host processor may be a multicore CPU or a multicore GPU.

Example 20

The system of example 10 may also include a display communicatively coupled to host processor, a network interface communicatively coupled to host processor, or a battery to power the host processor and the CIM circuit.

Example 21

An example method may include receiving, at a memory circuit having a memory array, a command to execute a MAC operation. The method may also include causing row access circuitry to drive multiple rows for selected bitcells of the memory array. The bitcells may be selected based on information included in the command. The method may also include causing column access circuitry to drive a bitline coupled with the selected bitcells. The method may also include causing an operational amplifier to cause the selected bitcells to output a current independent of a state stored in the selected bitcells by having a first input of the operational amplifier coupled with the bitline. A second input of the operational amplifier may be coupled with a reference voltage, and an output of the operational amplifier coupled to a resistance device that is also coupled to the bitline. The method may also include sensing an analog voltage output from the operational amplifier. The method may also include converting the analog voltage to a digital value to compute a MAC value and sending the MAC value to a requestor of the command to execute the MAC operation.

Example 22

The method of example 21, the memory array may include 6T SRAM bitcells at intersections of the rows with the bitline.

Example 23

The method of example 22, the 6T SRAM bitcells may include a first and second cross-coupled inventors that separately include a P-channel MOSFET and an N-channel MOSFET, the P-channel MOSFETs coupled to VDD and the N-channel MOSFETs coupled to ground.

Example 24

The method of example 23 may also include setting the reference voltage to an intermediate voltage value that falls between a voltage value for VDD and ground.

Example 25

The method of example 21, the memory array may include resistive-based random access memory (RAM) bitcells at intersections of the rows with the bitline.

Example 26

The method of example 21, the resistance device may include an active resistance device that includes a P-channel MOSFET or an N-channel MOSFET.

Example 27

The method of example 26, a gate for the P-channel MOSFET or the N-channel MOSFET may be coupled to a source voltage. The source voltage may set a resistance value for the active resistance device.

Example 28

The method of example 21, the resistance device may be a passive resistance device that includes a resistor.

Example 29

The method of example 21, converting the analog voltage to the digital value to compute the MAC value may include determining an analog voltage value $V_{out}$ based on $V_{Out}=R*IDS*\Sigma wx+V_{REF}$, where R is a resistance value for the resistance device, IDS is a difference between a current from a bitcell from among the selected bitcells storing a bit value of 1 and the bitcell storing a bit value of 0, w is a weight stored to individual bitcells from among the selected bitcells, x is an input activation for the individual bitcells and $V_{REF}$ is the reference voltage coupled with the second input of the operational amplifier.

Example 30

The method of example 21, the requestor of the command to execute the MAC operation may be a multicore CPU or a multicore GPU.

Flow diagrams as illustrated herein provide examples of sequences of various process actions. The flow diagrams can indicate operations to be executed by a software or firmware routine, as well as physical operations. A flow diagram can illustrate an example of the implementation of states of a finite state machine (FSM), which can be implemented in hardware and/or software. Although shown in a particular sequence or order, unless otherwise specified, the order of the actions can be modified. Thus, the illustrated diagrams should be understood only as examples, and the process can be performed in a different order, and some actions can be performed in parallel. Additionally, one or more actions can be omitted; thus, not all implementations will perform all actions.

To the extent various operations or functions are described herein, they can be described or defined as software code, instructions, configuration, and/or data. The content can be directly executable ("object" or "executable" form), source code, or difference code ("delta" or "patch" code). The software content of what is described herein can be provided via an article of manufacture with the content stored thereon, or via a method of operating a communication interface to send data via the communication interface. A machine readable storage medium can cause a machine to perform the functions or operations described and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters and/or sending signals to prepare the communication interface to provide a data signal describing the software content. The communication interface can be accessed via one or more commands or signals sent to the communication interface.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

It is emphasized that the Abstract of the Disclosure is provided to comply with 37 C.F.R. Section 1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single example for the purpose of streamlining the disclosure. This method of disclosure is not to be interpreted as reflecting an intention that the claimed examples require more features than are expressly recited in each claim. Rather, as the following claims reflect, inventive subject matter lies in less than all features of a single disclosed example. Thus, the following claims are hereby incorporated into the Detailed Description, with each claim standing on its own as a separate example. In the appended claims, the terms "including" and "in which" are used as the plain-English equivalents of the respective terms "comprising" and "wherein," respectively. Moreover, the terms "first, " "second," "third," and so forth, are used merely as labels, and are not intended to impose numerical requirements on their objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A memory circuit having a memory array, comprising:
   row access circuitry to drive multiple rows for selected bitcells of the memory array, the selected bitcells comprising 6-transistor (6T) static random access memory (SRAM) bitcells;
   column access circuitry to drive a bitline coupled with the selected 6T SRAM bitcells;
   an operational amplifier having a first input coupled with the bitline and a second input coupled with a reference voltage ($V_{REF}$), an output of the operational amplifier coupled to a resistance device that is also coupled to the bitline, the operational amplifier to cause individual 6T SRAM bitcells of the selected 6T SRAM bitcells to output a current independent of respective states stored in other 6T SRAM bitcells from among the selected 6T SRAM bitcells by causing $V_{REF}$ to match a drain source voltage ($V_{DS}$) that is a lower voltage than a respective transistor velocity saturation voltage ($V_{DSAT}$) of any of the selected 6T SRAM bitcells; and processing circuitry to include an analog processor to sense an analog voltage output from the operational amplifier and convert the analog voltage to a digital value.

2. The memory circuit of claim 1, wherein the selected 6T SRAM bitcells include a first and second cross-coupled invertors that separately include a P-channel metal oxide semiconductor field effect (MOSFET) and an N-channel MOSFET, the P-channel MOSFETs coupled to a supply voltage (VDD) and the N-channel MOSFETs coupled to ground.

3. The memory circuit of claim 2, wherein the reference voltage is set to an intermediate voltage value that falls between a voltage value for VDD and ground.

4. The memory circuit of claim 1, the resistance device comprises an active resistance device that includes a P-channel metal oxide semiconductor field effect (MOSFET) or an N-channel MOSFET.

5. The memory circuit of claim 4, comprising a gate for the P-channel MOSFET or the N-channel MOSFET coupled to a source voltage, the source voltage to set a resistance value for the active resistance device.

6. The memory circuit of claim 1, the resistance device comprises a passive resistance device that includes a resistor.

7. The memory circuit of claim 1, wherein to convert the analog voltage to the digital value includes determining an analog voltage value $V_{out}$ based on $V_{out}=R*IDS*\Sigma wx+V_{REF}$, where R is a resistance value for the resistance device, IDS is a difference between a current from a 6T SRAM bitcell from among the selected 6T SRAM bitcells storing a bit value of 1 and the 6T SRAM bitcell storing a bit value of 0, w is a weight stored to individual 6T SRAM bitcells from among the selected 6T SRAM bitcells, x is an input activation for the individual 6T SRAM bitcells and $V_{REF}$ is coupled with the second input of the operational amplifier.

8. The memory circuit of claim 7, further comprising:
the analog processor to use the digital value to perform an operation that includes a matrix-matrix multiplication, a vector-matrix multiplication, an element-wise operation, or an absolute difference computation.

9. A system comprising:
a host processor; and
a compute-in-memory (CIM) circuit that includes:
a memory array to include 6-transistor (6T) static random access memory (SRAM) bitcells;
row access circuitry to drive multiple rows for selected 6T SRAM bitcells of the memory array;
column access circuitry to drive a bitline coupled with the selected 6T SRAM bitcells;
an operational amplifier having a first input coupled with the bitline and a second input coupled with a reference voltage ($V_{REF}$), an output of the operational amplifier coupled to a resistance device that is also coupled to the bitline, the operational amplifier to cause individual 6T SRAM bitcells of the selected 6T SRAM bitcells to output a current independent of respective states stored in other 6T SRAM bitcells from among the selected 6T SRAM bitcells by causing $V_{REF}$ to match a drain source voltage ($V_{DS}$) that is a lower voltage than a respective transistor velocity saturation voltage ($V_{DSAT}$) of any of the selected 6T SRAM bitcells; and processing circuitry to include an analog processor to sense an analog voltage output from the operational amplifier and convert the analog voltage to a digital value.

10. The system of claim 9, wherein the selected 6T SRAM bitcells include a first and second cross-coupled invertors that separately include a P-channel metal oxide semiconductor field effect (MOSFET) and an N-channel MOSFET, the P-channel MOSFETs coupled to a supply voltage (VDD) and the N-channel MOSFETs coupled to ground.

11. The system of claim 10, wherein the reference voltage is set to an intermediate voltage value that falls between a voltage value for VDD and ground.

12. The system of claim 9, the resistance device comprises an active resistance device that includes a P-channel metal oxide semiconductor field effect (MOSFET) or an N-channel MOSFET.

13. The system of claim 12, comprising a gate for the P-channel MOSFET or the N-channel MOSFET coupled to a source voltage, the source voltage to set a resistance value for the active resistance device.

14. The system of claim 9, the resistance device comprises a passive resistance device that includes a resistor.

15. The system of claim 9, wherein to convert the analog voltage to the digital value includes determining an analog voltage value $V_{out}$ based on $V_{out}=R*IDS*\Sigma wx+V_{REF}$, where R is a resistance value for the resistance device, IDS is a difference between a current from a 6T SRAM bitcell from among the selected 6T SRAM bitcells storing a bit value of 1 and the 6T SRAM bitcell storing a bit value of 0, w is a weight stored to individual 6T SRAM bitcells from among the selected 6T SRAM bitcells, x is an input activation for the individual 6T SRAM bitcells and $V_{REF}$ is coupled with the second input of the operational amplifier.

16. The system of claim 15, further comprising:
the analog processor to use the digital value to perform an operation that includes a matrix-matrix multiplication, a vector-matrix multiplication, an element-wise operation, or an absolute difference computation.

17. The system of claim 9, wherein the host processor comprises a multicore central processing unit (CPU) or a multicore graphics processing unit (GPU).

18. The system of claim 9, further comprising:
a display communicatively coupled to host processor;
a network interface communicatively coupled to host processor; or
a battery to power the host processor and the CIM circuit.

* * * * *